United States Patent [19]

Berger et al.

[11] 4,121,333
[45] Oct. 24, 1978

[54] METHOD OF MANUFACTURING A TWO-PHASE CHARGE-TRANSFER SEMICONDUCTOR DEVICE AND A DEVICE OBTAINED BY SAID METHOD

[75] Inventors: Jean Luc Berger; Michel Bourrat; Yves Thenoz; Daniel Woehrn, all of Paris, France

[73] Assignee: Thomson-CSF, Paris, France

[21] Appl. No.: 801,751

[22] Filed: May 31, 1977

[30] Foreign Application Priority Data

Jun. 4, 1976 [FR] France .............................. 76 17074

[51] Int. Cl.² ............................................. B01J 17/00
[52] U.S. Cl. ....................................... 29/578; 29/590; 357/24; 357/91
[58] Field of Search .................... 29/578, 590; 357/24, 357/91

[56] References Cited

U.S. PATENT DOCUMENTS 4,047,215 9/1977 Frye ........................................ 357/91

Primary Examiner—W. Tupman
Attorney, Agent, or Firm—Roland Plottel

[57] ABSTRACT

A new method of manufacturing a two-phase charge-transfer device operating by the charge-coupled technique, in which the asymmetry means associated with each group of electrodes are constituted by impurity barriers implanted in the semiconductor substrate and are automatically positioned in relation to the electrodes, in particular by carrying out implantation operations through masks constituted by films of silicon nitride and by the electrodes themselves, the films of silicon nitride subsequently being completely removed.

This method makes it possible to create linear charge-transfer registers and photo-sensitive matrices.

6 Claims, 7 Drawing Figures

Fig.1 (a) et (b)

METHOD OF MANUFACTURING A TWO-PHASE CHARGE-TRANSFER SEMICONDUCTOR DEVICE AND A DEVICE OBTAINED BY SAID METHOD

The present invention relates to a novel method of manufacturing a two-phase, charge-transfer semiconductor device in which transfer is performed in charge-coupled fashion; the invention relates equally to the charge-transfer device obtained by this method, whether it be a linear device or a charge-transfer register or again a matrix device used for example as a photosensitive device.

Charge-coupled devices or C.C.D.'s are well known per se and require no description here; they have been described in numerous patents and articles and for example in the article by W. S. Boyle and G. E. Smith entitled "Charge coupled semiconductor devices" dated April 1970, pages 587 to 593.

Devices to which the present invention relates are two-phase devices, that is to say ones in which the electrodes delimiting the MIS capacitors (metal-insulator-semiconductor) and enabling control of charge-transfer along the device, are connected in such a way that they form two groups of electrodes. In these two-phase devices it is necessary to provide asymmetric means in order that charge transfer along a register always takes place in the same direction, a direction which we will call the "transfer direction" and which, by convention and in order to facilitate explanation, will be taken as being from left to right in the remainder of this description.

One major problem encountered currently in the manufacture of these devices is that of their manufacturing efficiency, and this problem is encountered primarily at the photogravure step.

One known method of improving this manufacturing efficiency is to manufacture each group of electrodes from different metallised areas deposited successively and separated from one another by an oxide. This method, although particularly simple to carry out in three-phase devices and of particular significance since it reduces the risks of short-circuiting between electrodes belonging to different phases, nevertheless creates a delicate problem in the case of two-phase devices. In other words, it is necessary for the asymmetric means, which generally consist either of a thickened oxide zone upon which the electrodes rest or of impurity barriers implanted in the substrate, should be properly positioned in relation to the electrodes.

Various methods have already been proposed in order, during the manufacture of the device, to automatically position the asymmetric means and the electrodes; one of these methods has been described in a French Patent Application filed on Aug. 1st, 1974 under No. 75.26792 and published under No. 2,280,975. In that patent application, the asymmetric means mainly consist in thickened oxide zones.

The present invention relates to a novel method of manufacture, which makes it possible to perform this automatic positioning operation in a simple fashion so that a device is obtained which possesses good properties; it relates more particularly to a two-phase device in which the transfer asymmetry is produced by impurity barriers implanted in the substrate and arranged at the start (at the left) of each electrode; in this context the word "start" designates the extremity of the MIS capacitor (metal-insulator-semiconductor) through which the charges arrive on the occasion of a transfer operation, whilst the word "end" designates that extremity through which the charges leave.

In order, in accordance with the invention, to create a two-phase charge-coupled device in which the asymmetric means consist of impurity barriers implanted in the substrate at the start of these capacitive elements, a certain number of deposits and etching operations are carried out upon the substrate so that it is possible automatically and without the need for recourse to very high precision in the selective etching of the layers, to effect the alignment of the start of the electrodes in each of the two groups (defining the two phases) and of their asymmetry means.

A novel method according to the invention, for manufacturing a two-phase charge-transfer semiconductor device operating by charge-coupled techniques, the two said phases respectively comprising a first and a second group of electrodes which on the one hand delimit upon a semiconductor substrate covered with an insulating layer a certain number of MIS capacitors for information storage, and on the other hand serve to control the transfer of information along said device, a single transfer direction being determined by asymmetry means which consist of impurity barriers implanted in the substrate at the start of said capacitors, said method comprising the following steps:

(a) on the semiconductor substrate a first thin, continuous insulating film is formed, itself covered by a second film capable of being etched by agents other than those etching the first, and said second film is selectively etched in order to remove it from the zones of a first group of asymmetry means corresponding to a first group of electrodes;

(b) implantation of impurities belonging to said first group of asymmetry means is carried out, said second film acting as a mask in this context;

(c) said second film is then selectively re-etched in order to uncovered zones of said first insulating film, which are located after the end of the zones corresponding to the asymmetry means belonging to the first group;

(d) conductive zones are formed astride the end of the remaining zones of said second thin film and a part of the zones of said first thin film uncovered in step (c), said conductive zones constituting the electrodes of the first group;

(e) implantation of impurities belonging to the second group of asymmetry means is carried out, said electrodes of the first group and the residual zones of the second film, constituting a mask in this context;

(f) all of the remaining zones of said second thin film are removed, this resulting in the automatic alignment of the start of the electrodes of the first group and their asymmetry means;

(g) a thin insulating film is deposited at least on the electrodes of the first group, and, between these electrodes, conductive zones are formed which ultimately constitute the electrodes of the second group.

A better understanding will be had from the ensuing description illustrated by the attached figures in which.

Figure 1:
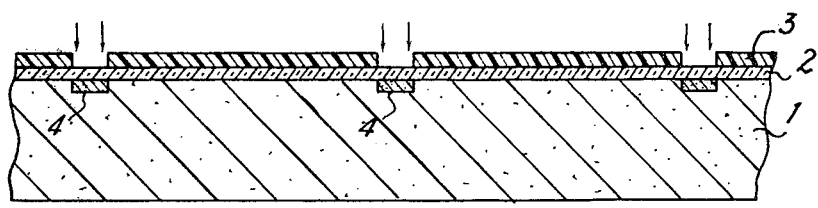
FIG. 1 illustrates sectional views (a) to (g) of the main steps in the manufacture of a device produced in accordance with the method of the invention.
Figure 1:
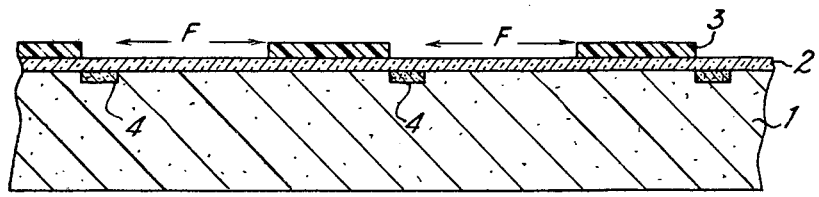
Figure 1:
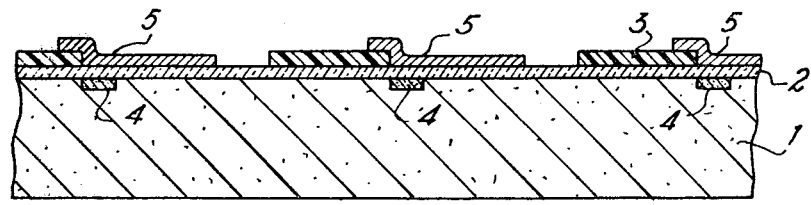
Figure 1:
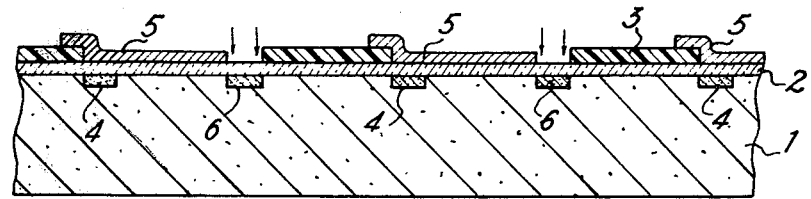
Figure 1:
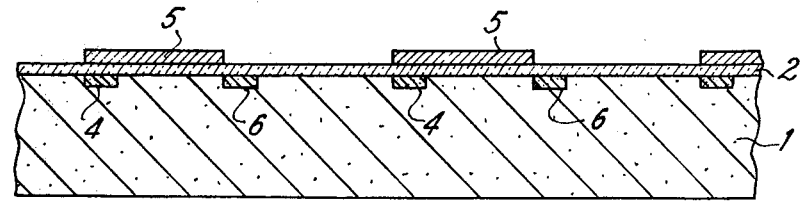
Figure 1:
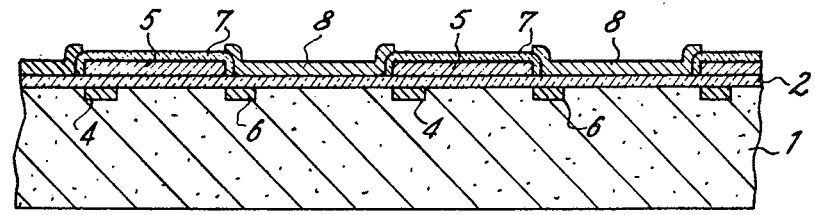

A charge-transfer device is conventionally formed from a semi-conductor substrate, for example P-type silicon, upon which an insulating layer of for example silica is formed; the electrodes are then deposited upon this insulating layer in order to form the MIS capacitors, or MOS capacitors if the insulating layer is an oxide, where the informations will be stored.

In the method in accordance with the invention, there is formed upon the semiconductor substrate 1 a first thin, continuous insulating film 2, of silica for example, and this film 2 is covered by a second film 3 constituted by a material which is resistent to etching by the agents used to etch the film 2. If the film 2 is silica, the film 3 will for example be silicon nitride. The film 3 is then selectively etched by conventional methods of masking and chemical etching, in order to bare equidistant zones in the oxide film 2, which correspond to the future zones of the asymmetry means belonging to the first group of electrodes; step (a Then the implantation of these asymmetry means is carried out by the implantation of impurities of the same kind as those encountered in the substrate (here P-type impurities), in the free zones of the film 3, step (b). The asymmetry means of the first group are constituted by barrier zones 4 having a higher inversion threshold than that of the neighbouring regions.

In step (c) a new chemical etching of the nitride film 3 is carried out in the zones indicated by the arrows F; in this way, zones of the oxide film 2 are uncovered which will later serve to automatically position on the one hand the electrodes of the first group and on the other asymmetry elements of the second group. It should be borne in mind that the positioning of the masks used to perform these local etching operations on the nitride, is not critical, the zones above the barriers 4 already being uncovered.

In step (d), the electrodes 5 of the first group are formed. Only a single stage has been shown here. One simple method of producing these electrodes 5 astride the end of the remaining zones of the film 3 and the bared ozide zones 2 which follow the latter, is to deposit a continuous film of a conductive material, for example suitably doped polycrystalline silicon, and to carry out selective etching of this continuous film by a masking operation; photo-etching of silicon is conventionally performed by an oxidation of its surface prior to the deposition of the resin used for the actual etching operation. The oxide film, whose sole function conventionally is that of enabling photo-etching of the silicon to be carried out, has not been shown and nor have the photo-sensitive resins masks been shown in any of the steps in fact. It should be pointed out here, once again, that the accuracy of positioning of the mask is not critical. It is merely necessary that the electrodes should be partly astride the end of the residual zones of the film 3.

In step (e) the implantation of the asymmetry means belonging to the second group is performed by implantation of impurities, as in step (b); the mask in this case is constituted by the assembly of residual zones of the nitride film 3, and of the electrodes 5. The barrier zones 6 are created, the start of which is automatically aligned with the end of the electrodes 5 in the first group.

In step (f), all of the residual zones of the nitride film 3 are removed by chemical etching; in an over-etching operation, those nitride areas located beneath the conductive zones 5 are eliminated, the conductive parts 5 which are thus unsupported and which are thin, are eliminated automatically by breaking away and the start of the electrodes 5 and the start of their asymmetry means, the barriers 4, are automatically aligned in this way. It is equally possible to use a chemical agent which will etch both the nitride and the polycrystalline silicon, but not the silica. The "cap" of polycrystalline silicon is then eliminated by an etching operation which is carried out underneath. This chemical agent may be a gas plasma (freonoxygen) for example.

Then, in step (g), a thin insulating film is deposited by oxidising the whole of the free surface for example, in order to insulate the electrodes 5 of the first group from the future electrodes of the second group, whereafter the electrodes 8 of the second group, in doped polycrystalline silicon, are then deposited, these electrodes automatically interspersing themselves between the end of one electrode 5 in the first group and the start of the next electrode 5. Thus, automatic alignment of the start of the effective parts of the electrodes 8 in the second group, with their asymmetry means 6, is brought about.

Thereafter, as those skilled in the art will appreciate, it is merely necessary to connect the electrodes into two groups, two by two, to obtain the desired two-phase device.

Here, individual electrodes 8 of the second group have been shown. It should be noted that these electrodes could just as well be manufactured in the form of a continuous conductive film as shown at 22 in FIG. 2; the only effective parts of this continuous film are those located closest to the substrate 1, that is to say between the electrodes 5 of the first group. Once again, we see the functional arrangement of FIG. 1 (g).

Figure 2:
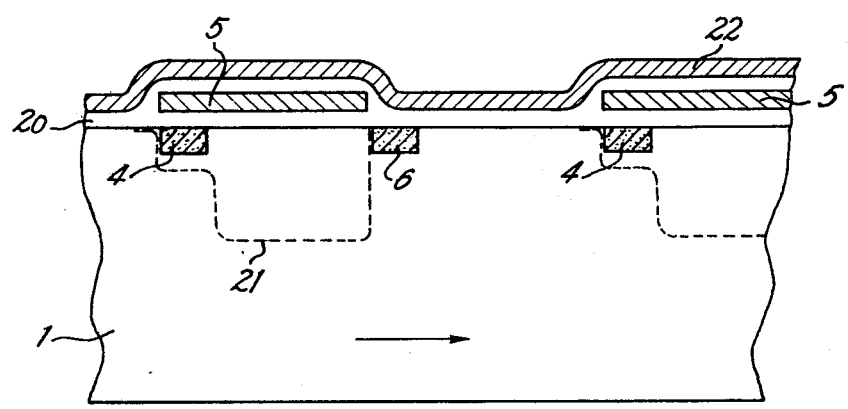
FIG. 2 is an enlarged sectional view of part of a charge transfer device obtained by the method of the invention. This figure simply illustrates the essential steps of the method; the subsidiary, intermediate steps, which are not basically original and which are not necessarily the only ones which could be used, will not be described in a detailed way.

FIG. 2 schematically illustrates on a slightly larger scale in relation to the preceding illustrations, part of a charge-transfer device in accordance with the invention. To simplify the figure, the oxide 20 has not been cross-hatched and nor has the substrate 1. The shape of the frontier 21 of the space-charge zone between the electrodes 5 (here assumed to be the ones storing the information), has been shown; the arrow T indicates the direction of transfer.

The electrodes 8 of the second group are here replaced by a continuous film 22 as described above.

A device of this kind can be utilised in order, in a manner known per se, to form a linear shift-register with an electrical or optical input, or a photo-sensitive matrix. This technology lends itself particularly well to the manufacture of matrices of this kind organised in accordance with the known principle of field matrices.

In a general way, the devices obtained by the method in accordance with the present invention have substantial structural advantages: The only insulating material left in the final structure is oxide, and this avoids the problems of annealing of the impurities masked by the nitride when the structures contain the latter, something which is the case in certain prior art devices; the two phases have identical asymmetry means; it is possible to achieve a high level of compactness; the risks of short-circuiting between electrodes of one and the same phase and between electrodes in different phases, are small.

Of course, the invention is not limited to the embodiments described and shown, which were given solely by way of example.

What is claimed is;

1. A method of manufacturing a two-phase charge-transfer semiconductor device operating by charge-coupled techniques, the two said phases respectively comprising a first and a second group of electrodes which on the one hand delimit upon a semiconductor substrate covered with an insulating layer a certain number of MIS capacitors for information storage, and on the other hand serve to control the transfer of information along said device, a single transfer direction being determined by asymmetry means which consist of impurity barriers implanted in the substrate at that start of said capacitors, the word "start" designating the extremity of the MIS capacitors through which the charges arrive on the occasion of a transfer operation whilst the word "end" designating that extremity through which the charges leave, said method comprising the following steps:

(a) on the semiconductor substrate (1) a first thin, continuous insulating film (2) is formed, itself covered by a second film (3) capable of being etched by agents other than those etching the first, and said second film (3) is selectively etched in order to remove it from the zones, corresponding to the future zones of asymmetry means belonging to the first group of electrodes;

(b) implantation of impurities constituting the asymmetry means (4) belonging to the first group of electrodes is carried out in the free zones of the film (3), said second film (3) acting as a mask in this context;

(c) said second film (3) is then selectively re-etched in order to uncover zones (F) of said first insulating film (2), which are located after the end of the zones corresponding to the asymmetry means (4) belonging to the first group of electrodes;

(d) conductive zones (5) are formed astride the end of the remaining zones of said second thin film (3) and a part of the zones of said first insulating film (2) uncovered in step (c), said conductive zones cnstituting the electrodes (5) of the first group;

(e) implantation of impurities belonging to the second group of asymmetry means (6) is carried out, said electrodes (5) of the first group and the residual zones of the second film (3) constituting a mask in this context;

(f) all of the remaining zones of said second thin film (3) are removed, the conductive zones (5) which were supported by the thin film (3) are also eliminated, this resulting in the automatic alignment of the start of electrodes (5) of the first group and their asymmetry means (4);

(g) a thin insulating film (7) is deposited at least on the electrodes (5) of the first group, and, between these electrodes conductive zones (8) are formed which ultimately constitute the electrodes of the second group, automatic alignment of the start of the electrodes (8) of the second group with their asymmetry means (6) being brought about.

2. A method as claimed in claim 1, wherein the substrate (1) is made of silicon.

3. A method as claimed in claim 2, wherein said first insulating film (2) is silicon oxide or silica, as also are the insulating films (7) deposited upon said electrodes (5) of the first group.

4. A method as claimed in claim 3, wherein said second film (3) is silicon nitride.

5. A method as claimed in claim 4, wherein the electrodes (5) of the first group are formed by the deposition of a continuous film of doped polycrystalline silicon, said continuous film subsequently being selectively etched in order to produce said electrodes (5).

6. A method as claimed in claim 4, wherein the electrodes of the second group are formed by the deposition of a continuous film of doped polycrystalline silicon upon the assembly of bared zones of said first film (2), and of silica films (7) upon the electrodes (5) of the first group, the electrodes of the second group being constituted by the silicon zones deposited between the electrodes (5) of the first group.

* * * * *